(12) United States Patent
Huang (10) Patent No.: US 11,798,841 B2
(45) Date of Patent: Oct. 24, 2023

(54) PLANARIZATION METHOD

(71) Applicant: Powerchip Semiconductor Manufacturing Corporation, Hsinchu (TW)

(72) Inventor: Yen-Jhih Huang, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 261 days.

(21) Appl. No.: 17/160,402

(22) Filed: Jan. 28, 2021

(65) Prior Publication Data

US 2022/0216096 A1 Jul. 7, 2022

(30) Foreign Application Priority Data

Jan. 4, 2021 (TW) .................................. 110100051

(51) Int. Cl.
*H01L 21/768* (2006.01)
*H01L 21/3213* (2006.01)
*H01L 21/321* (2006.01)

(52) U.S. Cl.
CPC ...... *H01L 21/7684* (2013.01); *H01L 21/3212* (2013.01); *H01L 21/32134* (2013.01)

(58) Field of Classification Search
CPC .......... H01L 21/7684; H01L 21/21055; H01L 21/3212; H01L 21/32134; H01L 21/76819; H01L 27/108
See application file for complete search history.

(56) References Cited

U.S. PATENT DOCUMENTS

| 5,173,151 | A | * | 12/1992 | Namose | ............ | H01L 21/31116 |
| | | | | | | 257/E21.252 |
| 5,851,899 | A | | 12/1998 | Weigand | | |
| 6,391,706 | B2 | | 5/2002 | Wu et al. | | |
| 6,759,345 | B2 | | 7/2004 | Kawano | | |
| 6,815,336 | B1 | | 11/2004 | Shue et al. | | |
| 7,164,837 | B2 | * | 1/2007 | Kang | ..................... | G02B 6/132 |
| | | | | | | 385/129 |

(Continued)

FOREIGN PATENT DOCUMENTS

| CN | 110534150 | A | * | 12/2019 | ........... H01L 27/108 |
| TW | 201801181 | | | 1/2018 | |

*Primary Examiner* — Mark W Tornow
*Assistant Examiner* — David Paul Sedorook
(74) *Attorney, Agent, or Firm* — JCIPRNET (57) ABSTRACT

A planarization method including the following steps is provided. A substrate is provided. The substrate includes a first region and a second region. A material layer is formed on the substrate. The top surface of the material layer in the first region is lower than the top surface of the material layer in the second region. A patterned photoresist layer is formed on the material layer in the first region. A first etching process is performed on the patterned photoresist layer, so that the top surface of the patterned photoresist layer and the top surface of the material layer in the second region have substantially the same height. A second etching process is performed on the patterned photoresist layer and the material layer. In the second etching process, the etching rate of the patterned photoresist layer is substantially the same as the etching rate of the material layer.

14 Claims, 6 Drawing Sheets

(56) References Cited

U.S. PATENT DOCUMENTS

| | | | |
|---|---|---|---|
| 9,391,081 B1* | 7/2016 | Shishido | H10B 41/35 |
| 9,515,022 B2* | 12/2016 | Kwon | H01L 29/6653 |
| 2008/0214008 A1* | 9/2008 | Moritoki et al. | H01L 21/311 |
| | | | 438/694 |
| 2014/1065523 * | 4/2014 | Koldiaev et al. | H01L 21/8238 |
| 2017/0372900 A1* | 12/2017 | Tsai | H01L 21/0274 |
| 2018/0190665 A1* | 7/2018 | Huang | H10B 12/50 |
| 2019/0096686 A1 | 3/2019 | Hsu et al. | |
| 2019/0103302 A1* | 4/2019 | Yoon | H10B 12/482 |
| 2019/0157097 A1* | 5/2019 | Chang et al. | H01K 21/3105 |
| 2019/0157214 A1* | 5/2019 | Kim | H01L 23/5226 |

\* cited by examiner

PLANARIZATION METHOD

CROSS-REFERENCE TO RELATED APPLICATION

This application claims the priority benefit of Taiwanese application no. 110100051, filed on Jan. 4, 2021. The entirety of the above-mentioned patent application is hereby incorporated by reference herein and made a part of this specification.

BACKGROUND OF THE INVENTION

Field of the Invention

The invention relates to a semiconductor manufacturing process, and particularly relates to a planarization method.

Description of Related Art

In the semiconductor manufacturing process, there may be a height difference between different device regions due to factors such as etch loading effect or different pattern density. Currently, the commonly used planarization method is the chemical mechanical polishing method. However, even if the planarization process is performed by the chemical mechanical polishing process, due to the impact of the polishing loading effect, there will still be a certain degree of height difference between different device regions, which will adversely affect product performance or yield.

SUMMARY OF THE INVENTION

The invention provides a planarization method, which can effectively reduce the height difference between different device regions.

The invention provides a planarization method, which includes the following steps. A substrate is provided. The substrate includes a first region and a second region. A material layer is formed on the substrate. The top surface of the material layer in the first region is lower than the top surface of the material layer in the second region. A patterned photoresist layer is formed on the material layer in the first region. The patterned photoresist layer exposes the top surface of the material layer in the second region. The top surface of the patterned photoresist layer is higher than the top surface of the material layer in the second region. A first etching process is performed on the patterned photoresist layer, so that the top surface of the patterned photoresist layer and the top surface of the material layer in the second region have substantially the same height. A second etching process is performed on the patterned photoresist layer and the material layer. In the second etching process, the etching rate of the patterned photoresist layer is substantially the same as the etching rate of the material layer.

According to an embodiment of the invention, in the planarization method, in the first etching process, the etching rate of the patterned photoresist layer may be greater than the etching rate of the material layer.

According to an embodiment of the invention, in the planarization method, the first etching process may be a dry etching process.

According to an embodiment of the invention, in the planarization method, the gas used in the first etching process may include oxygen ($O_2$), sulfur dioxide ($SO_2$), nitrogen ($N_2$), hydrogen ($H_2$), carbon monoxide (CO), carbon dioxide ($CO_2$), or a combination thereof.

According to an embodiment of the invention, in the planarization method, after the second etching process is performed, the entire structure height of the first region may be substantially the same as the entire structure height of the second region.

According to an embodiment of the invention, in the planarization method, the patterned photoresist layer may be removed by the second etching process.

According to an embodiment of the invention, in the planarization method, the second etching process may be a dry etching process.

According to an embodiment of the invention, in the planarization method, the second etching process may be a non-selective etching process.

According to an embodiment of the invention, in the planarization method, the gas used in the second etching process may be carbon fluoride ($C_xF_y$).

According to an embodiment of the invention, in the planarization method, the first region and the second region may be one and the other of a central region and an edge region respectively.

According to an embodiment of the invention, in the planarization method, the central region may be a memory cell region, and the edge region may be a peripheral circuit region.

According to an embodiment of the invention, the planarization method may further include performing following steps before forming the material layer. A buried word line structure is formed in the substrate in the memory cell region. A bit line structure is formed on the substrate on one side of the buried word line structure. A first hard mask layer is formed on the bit line structure. A first cap layer is formed on the first hard mask layer.

According to an embodiment of the invention, the planarization method may further include the following step. A contact is formed on the substrate on the other side of the buried word line structure before forming the material layer.

According to an embodiment of the invention, the planarization method may further include the following step. A second hard mask layer is formed on the contact before forming the material layer.

According to an embodiment of the invention, in the planarization method, the second hard mask layer may be removed by the second etching process.

According to an embodiment of the invention, the planarization method may further include performing following steps before forming the material layer. A transistor is formed on the substrate in the peripheral circuit region. The transistor may include a gate and a dielectric layer. The gate is located on the substrate in the memory cell region. The dielectric layer is located between the gate and the substrate. A second hard mask layer is formed on the gate. A second cap layer is formed on the second hard mask layer.

According to an embodiment of the invention, in the planarization method, the top surface of the second cap layer may be higher than the top surface of the first cap layer.

According to an embodiment of the invention, in the planarization method, the material layer may cover the first cap layer and the second cap layer.

According to an embodiment of the invention, the planarization method may further include the following step. The second etching process may be performed on the first cap layer, the second cap layer, the first hard mask layer, and the second hard mask layer.

According to an embodiment of the invention, in the planarization method, in the second etching process, the etching rate of the patterned photoresist layer, the etching rate of the material layer, the etching rate of the first cap layer, the etching rate of the second cap layer, the etching rate of the first hard mask layer, and the etching rate of the second hard mask layer may be substantially the same.

Based on the above description, in the planarization method according to the invention, the top surface of the patterned photoresist layer and the top surface of the material layer in the second region can have substantially the same height through the first etching process. In addition, in the second etching process, the etching rate of the patterned photoresist layer is substantially the same as the etching rate of the material layer. Therefore, the planarization method according to the invention can effectively reduce the height difference between the first region and the second region, thereby improving product performance and/or yield.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are cross-sectional views illustrating a planarization process according to an embodiment of the invention. FIG. 1F is a cross-sectional view after removing a portion of the contact in FIG. 1E.

Figure 1A:
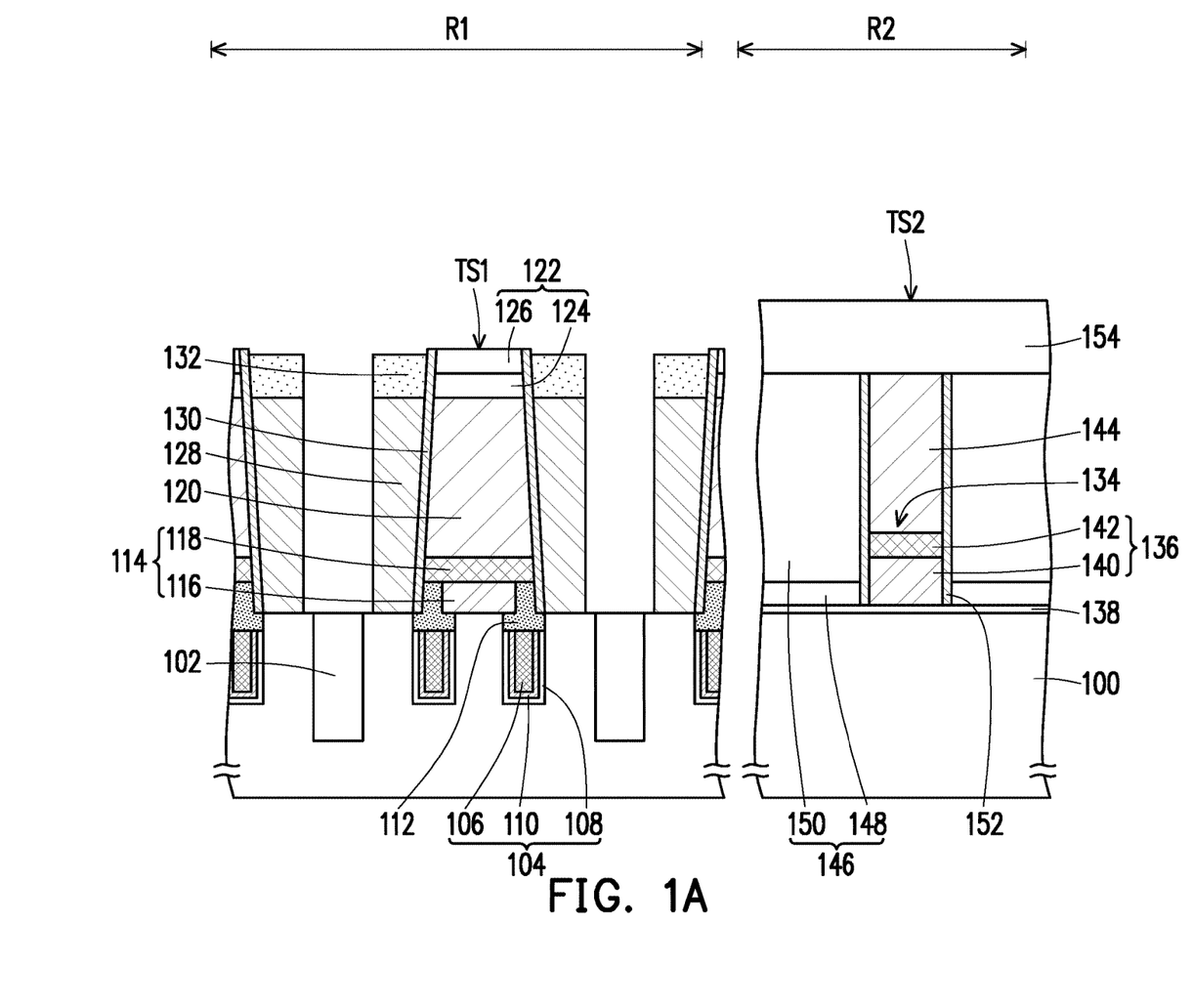
FIG. 1A to FIG. 1E are cross-sectional views illustrating a planarization process according to an embodiment of the invention.

Referring to FIG. 1A, a substrate 100 is provided. The substrate 100 includes a first region R1 and a second region R2. The first region R1 and the second region R2 may be one and the other of a central region and an edge region respectively. In some embodiments, the central region and the edge region may be located at the center and the edge of the chip respectively. In the present embodiment, the first region R1 is, for example, the central region, and the second region R2 is, for example, the edge region, but the invention is not limited thereto. In other embodiments, the first region R1 may be the edge region, and the second region R2 may be the central region. In the present embodiment, the central region may be a memory cell region, and the edge region may be a peripheral circuit region, but the invention is not limited thereto. For example, the first region R1 may be the memory cell region for forming a memory cell (e.g., a dynamic random access memory (DRAM) cell), and the second region R2 may be the peripheral circuit region for forming a transistor used as a logic device. The substrate 100 is, for example, a semiconductor substrate such as a silicon substrate. In addition, an isolation structure 102 may be formed in the substrate 100. The isolation structure 102 may be a single-layer structure or a multilayer structure. The isolation structure 102 is, for example, a shallow trench isolation structure (STI). The material of the isolation structure 102 is, for example, silicon oxide.

A buried word line structure 104 may be formed in the substrate 100 in the first region R1 (e.g., the memory cell region). The buried word line structure 104 may include a buried word line 106 and a dielectric layer 108. The buried word line 106 is located in the substrate 100. The material of the buried word line 106 is, for example, tungsten (W), aluminum (Al), or copper (Cu). The dielectric layer 108 is located between the buried word line 106 and the substrate 100. The material of the dielectric layer 108 is, for example, silicon oxide. In addition, the buried word line structure 104 may further include a barrier layer 110. The barrier layer 110 is located between the buried word line 106 and the dielectric layer 108. The material of the barrier layer 110 is, for example, titanium (Ti), titanium nitride (TiN), tantalum (Ta), tantalum nitride (TaN), or a combination thereof. Furthermore, a cap layer 112 may be formed on the buried word line structure 104. The material of the cap layer 112 is, for example, silicon nitride. Moreover, a desired doped region (not shown) may be formed in the substrate 100 in the first region R1 according to product requirements.

A bit line structure 114 may be formed on the substrate 100 on one side of the buried word line structure 104. The bit line structure 114 may include a contact 116 and a conductive line 118. The contact 116 is located on the substrate 100. The contact 116 may be used as a bit line contact. The material of the contact 116 is, for example, a conductive material such as doped polysilicon. The conductive line 118 is located on the contact 116. The conductive line 118 may be used as a bit line. The material of the conductive line 118 is, for example, tungsten, aluminum, or copper. In addition, a hard mask layer 120 may be formed on the bit line structure 114. The material of the hard mask layer 120 is, for example, silicon nitride.

Furthermore, a cap layer 122 may be formed on the hard mask layer 120. The cap layer 122 may a single-layer structure or a multilayer structure. In the present embodiment, the cap layer 122 is, for example, the multilayer structure, but the invention is not limited thereto. For example, the cap layer 122 may include a cap layer 124 and a cap layer 126. The cap layer 124 is located on the hard mask layer 120. The material of the cap layer 124 is, for example, silicon oxide. The cap layer 126 is located on the cap layer 124. The material of the cap layer 126 is, for example, silicon oxide.

A contact 128 may be formed on the substrate 100 on the other side of the buried word line structure 104. The contact 128 may be used as a storage node contact. The material of contact 128 is, for example, a conductive material such as doped polysilicon. In addition, a liner layer 130 may be formed between the contact 128 and the bit line structure 114. The liner layer 130 may be located between the contact 128 and the conductive line 118. The material of the liner layer 130 is, for example, a dielectric material such as silicon nitride. Furthermore, a hard mask layer 132 may be formed on the contact 128. The material of the hard mask layer 132 is, for example, silicon nitride.

A transistor 134 may be formed on the substrate 100 in the second region R2. The transistor 134 is, for example, a metal-oxide-semiconductor field-effect transistor (MOSFET), but the invention is not limited thereto. The transistor 134 may include a gate 136 and a dielectric layer 138. The gate 136 is located on the substrate 100. The gate 136 may be a single-layer structure or a multi-layer structure. In the present embodiment, the gate 136 is, for example, the multilayer structure, but the invention is not limited thereto. For example, the gate 136 may include a conductive layer 140 and a conductive layer 142. The conductive layer 140 is located on the substrate 100. The material of the conductive layer 140 is, for example, doped polysilicon. The conductive layer 142 is located on the conductive layer 140. The material of the conductive layer 142 is, for example, tungsten, aluminum, or copper. The dielectric layer 138 is located between the gate 136 and the substrate 100. The material of the dielectric layer 138 is, for example, silicon oxide. The transistor 134 may further include components such as a doped region (not shown) located in the substrate 100.

In addition, a hard mask layer 144 may be formed on the gate 136. The material of the hard mask layer 144 is, for example, silicon nitride. A dielectric layer 146 may be formed on two sides of the gate 136. The dielectric layer 146 may be a single-layer structure or a multilayer structure. In the present embodiment, the dielectric layer 146 is, for example, the multilayer structure, but the invention is not limited thereto. For example, the dielectric layer 146 may include a dielectric layer 148 and a dielectric layer 150. The dielectric layer 148 may be located on the dielectric layer 138. The material of the dielectric layer 148 is, for example, silicon oxide. The dielectric layer 150 is located on the dielectric layer 148. The material of the dielectric layer 150 is, for example, silicon oxide. A spacer 152 may be formed between the dielectric layer 146 and the gate 136. The material of the spacer 152 is, for example, silicon nitride. A cap layer 154 may be formed on the hard mask layer 144. Due to the etch loading effect, the top surface TS2 of the cap layer 154 may be higher than the top surface TS1 of the cap layer 122. The material of the cap layer 154 is, for example, silicon oxide.

Figure 1B:
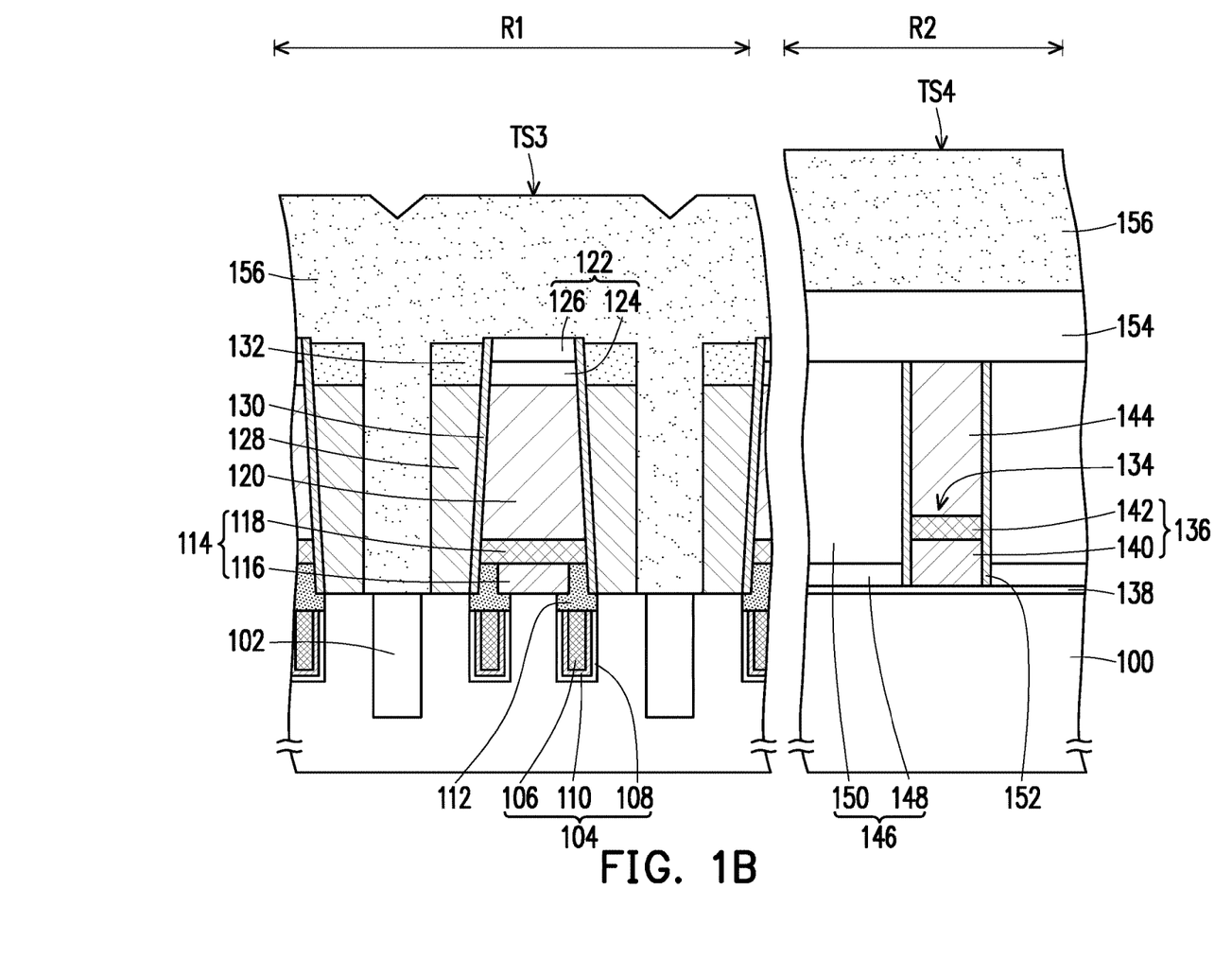

Referring to FIG. 1B, a material layer 156 is formed on the substrate 100. For example, the material layer 156 may cover the cap layer 122 and the cap layer 154. The top surface TS3 of the material layer 156 in the first region R1 is lower than the top surface TS4 of the material layer 156 in the second region R2. In some embodiments, the top surface TS3 of the material layer 156 in the first region R1 is lower than the top surface TS4 of the material layer 156 in the second region R2 is because of the influence of the topography of the substrate 100. In the present embodiment, the material layer 156 may be a dielectric layer, but the invention is not limited thereto. For example, the material of the material layer 156 is a dielectric material such as silicon nitride. The method of forming the material layer 156 is, for example, a chemical vapor deposition method.

Figure 1C:
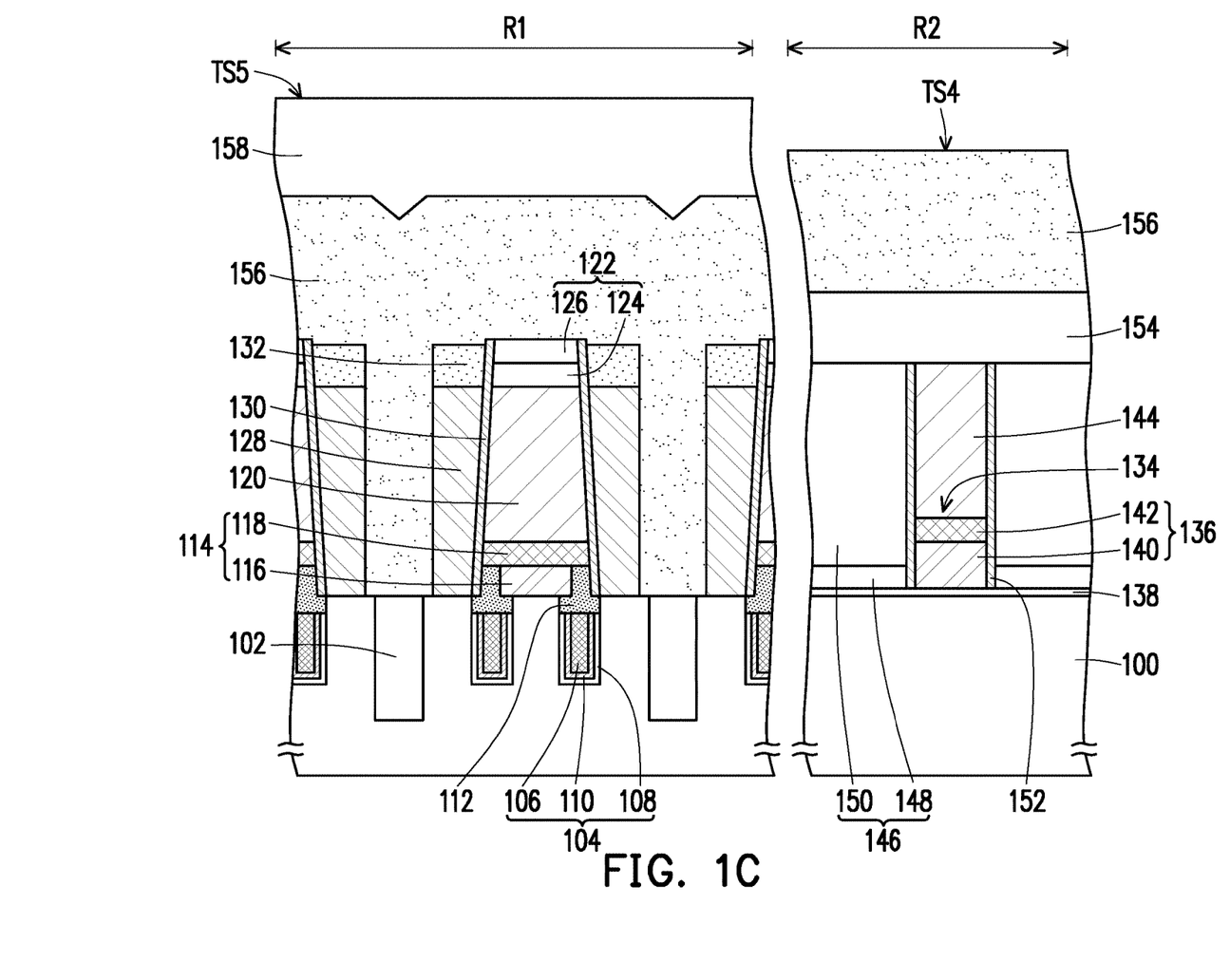

Referring to FIG. 1C, a patterned photoresist layer 158 is formed on the material layer 156 in the first region R1. The patterned photoresist layer 158 exposes the top surface TS4 of the material layer 156 in the second region R2. The top surface TS5 of the patterned photoresist layer 158 is higher than the top surface TS4 of the material layer 156 in the second region R2. The patterned photoresist layer 158 may be formed by a lithography process.

Figure 1D:
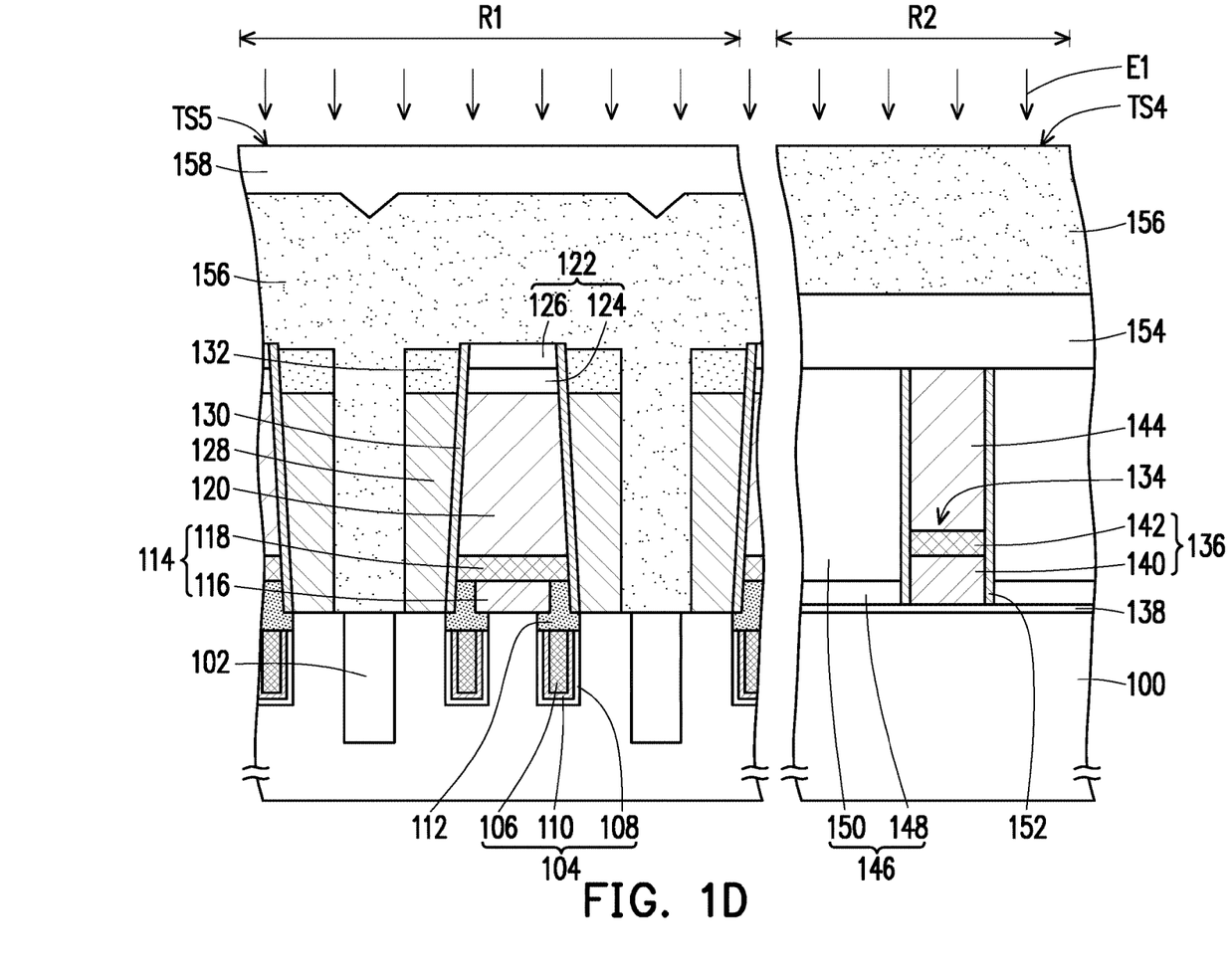

Referring to FIG. 1D, a first etching process E1 is performed on the patterned photoresist layer 158, so that the top surface TS5 of the patterned photoresist layer 158 and the top surface TS4 of the material layer 156 in the second region R2 have substantially the same height. The term "substantially" as used herein means that when there is an "allowable deviation", it also belongs to the scope of the invention. In the first etching process E1, the etching rate of the patterned photoresist layer 158 may be greater than the etching rate of the material layer 156. In some embodiments, when the height of the patterned photoresist layer 158 is reduced by removing a portion of the patterned photoresist layer 158 through the first etching process E1, the first etching process E1 hardly damages the material layer 156. The first etching process E1 may be a dry etching process. The gas used in the first etching process E1 may include oxygen ($O_2$), sulfur dioxide ($SO_2$), nitrogen ($N_2$), hydrogen ($H_2$), carbon monoxide (CO), carbon dioxide ($CO_2$), or a combination thereof.

Figure 1E:
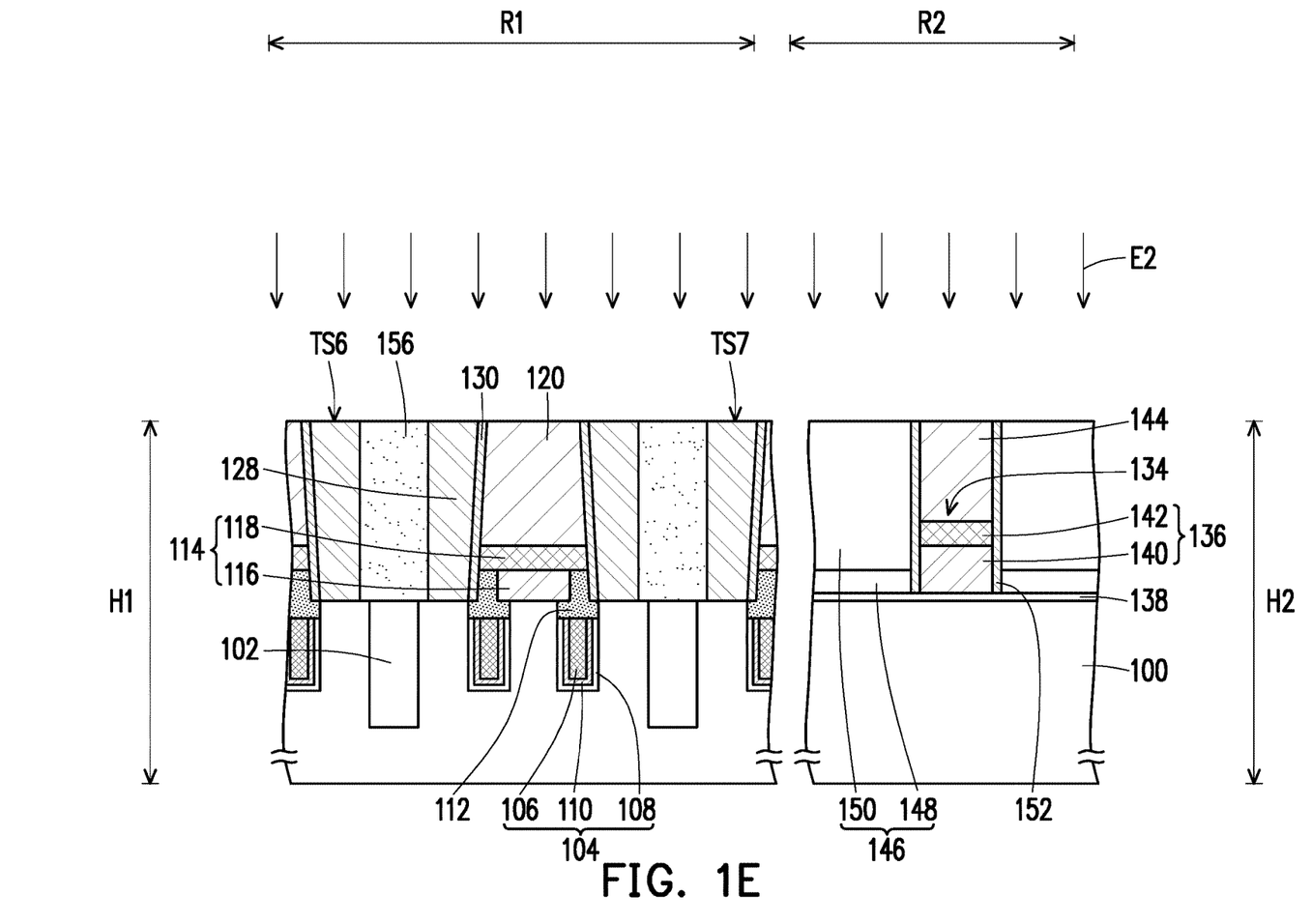
Figure 1F:
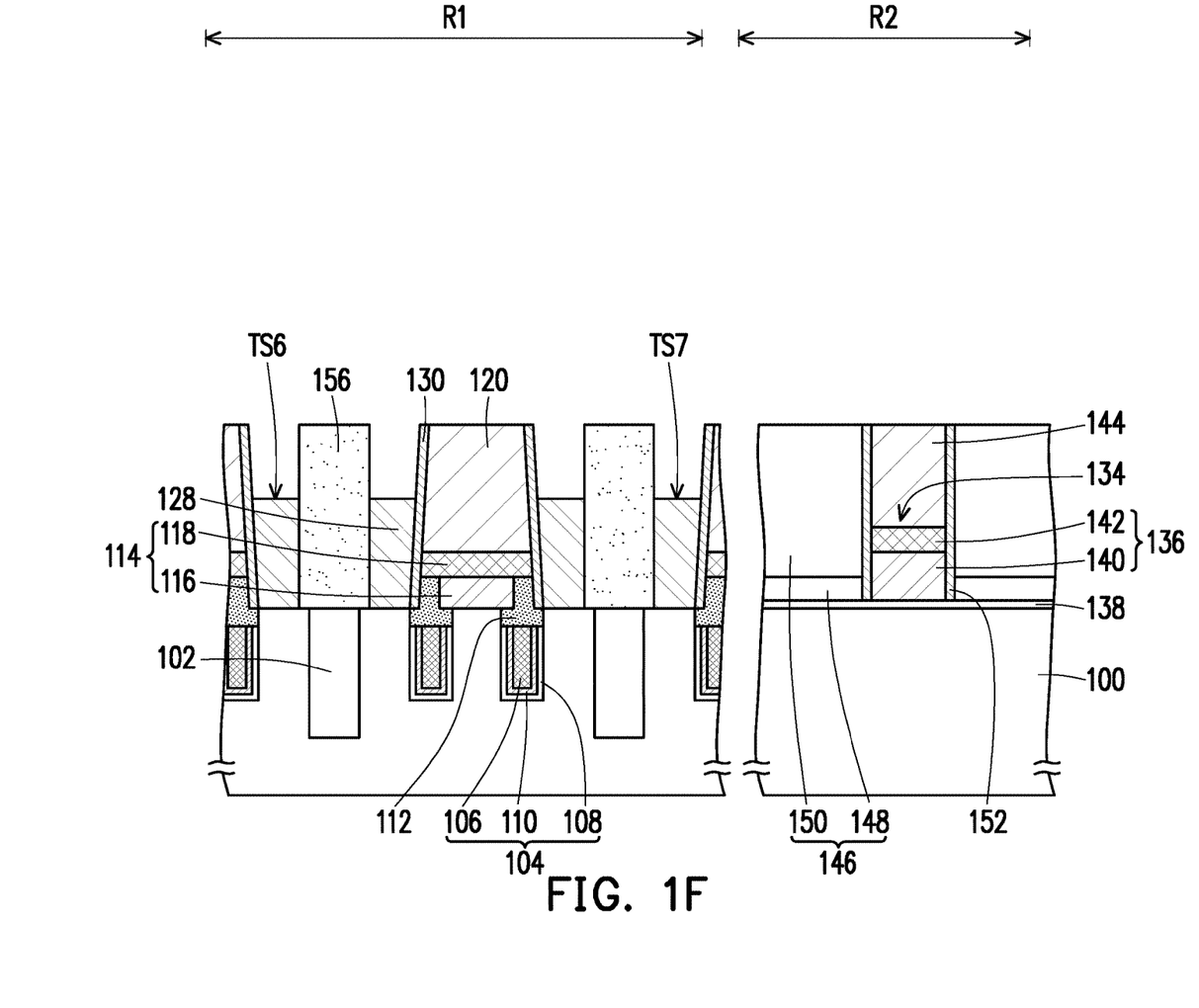
FIG. 1F is a cross-sectional view after removing a portion of the contact in FIG. 1E.

Referring to FIG. 1E, a second etching process E2 is performed on the patterned photoresist layer 158 and the material layer 156. In the second etching process E2, the etching rate of the patterned photoresist layer 158 is substantially the same as the etching rate of the material layer 156. Therefore, after performing the second etching process E2 for a period of time, the second etching process E2 may remove the patterned photoresist layer 158 and a portion of the material layer 156 in FIG. 1D, and the material layer 156 in the first region R1 and the material layer 156 in the second region R2 can have substantially the same height and start to become flat. The second etching process E2 may be a dry etching process. The gas used in the second etching process E2 may include carbon fluoride such as carbon tetrafluoride.

In some embodiments, the second etching process E2 may be performed on the cap layer 122, the cap layer 154, the hard mask layer 120, the hard mask layer 144, the hard mask layer 132, the liner layer 130, the contact 128, the dielectric layer 150, and the spacer 152. In the present embodiment, the patterned photoresist layer 158, a portion of the material layer 156, the cap layer 122, the cap layer 154, a portion of the hard mask layer 120, a portion of the hard mask layer 144, and the hard mask layer 132, a portion of the liner layer 130, a portion of the contact 128, a portion of the dielectric layer 150, and a portion of the spacer 152 may be removed by the second etching process E2, but the invention is not limited thereto. In some embodiments, the second etching process E2 may be a non-selective etching process, and the non-selective etching process refers to an etching process that has substantially the same etching rate for all layers to be etched. In the second etching process E2 using the non-selective etching process, the etching rate of the patterned photoresist layer 158, the etching rate of the material layer 156, the etching rate of the cap layer 122, the etching rate of the cap layer 154, the etching rate of the hard mask layer 120, the etching rate of the hard mask layer 144, the etching rate of the hard mask layer 132, the etching rate of the liner layer 130, the etching rate of the contact 128, the etching rate of the dielectric layer 150, and the etching rate of the spacer 152 may be substantially the same. In addition, after the second etching process E2 is performed, the entire structure height H1 of the first region R1 may be substantially the same as the entire structure height H2 of the second region R2 to achieve a planarization effect.

In addition, in the case that the first region R1 is a DRAM cell region, the subsequent steps of completing the DRAM cell (e.g., the step of forming a capacitor electrically connected to the contact 128) are known to one of ordinary skill in the art, and the description thereof is omitted here.

Based on the above embodiments, in the planarization method, the top surface TS5 of the patterned photoresist layer 158 and the top surface TS4 of the material layer 156 in the second region R2 can have substantially the same height through the first etching process E1. In addition, in the second etching process E2, the etching rate of the patterned photoresist layer 158 is substantially the same as the etching rate of the material layer 156. Therefore, the planarization method of the above embodiment can effectively reduce the height difference between the first region R1 and the second region R2, thereby improving product performance and/or yield.

For example, when the planarization method of FIG. 1B to FIG. 1E is applied to the semiconductor structure of FIG. 1A, in FIG. 1E, the top surface TS6 of the contact 128 near the center of the first region R1 and the top surface TS7 of the contact 128 near the edge of the first region R1 (i.e., near the second region R2) can have substantially the same height. Therefore, as shown in FIG. 1F, after performing the etching process (e.g., dry etching process) for removing a portion of the contact 128, the top surface TS6 of the contact 128 near the center of the first region R1 and the top surface TS7 of the contact 128 near the edge of the first region R1 can still have substantially the same height. In this way, the problem of uneven height of the contacts 128 can be avoided, thereby improving product performance and/or yield. In addition, when the first etching process E1, the second etching process E2, and the etching process for removing a portion of the contact 128 are all dry etching processes, the etching processes can be performed in the same etching machine, so that defects caused by particle contamination during the wafer transfer process between different machines can be prevented, and the cost can be reduced.

Furthermore, although the planarization method of the above embodiment is applied to the semiconductor structure of FIG. 1A as an example for description, the invention is not limited thereto. In other embodiments, the above planarization method may be applied to other semiconductor structures.

In summary, in the planarization method of the above embodiments, the height difference between different device regions can be reduced by the first etching process and the second etching process, thereby improving product performance and/or yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A planarization method, comprising:
   providing a substrate, wherein the substrate comprises a first region and a second region, the first region is a central region and the second region is an edge region, or the first region is the edge region and the second region is the central region, and the central region comprises a memory cell region, and the edge region comprises a peripheral circuit region;
   forming a material layer on the substrate, wherein a top surface of the material layer in the first region is lower than a top surface of the material layer in the second region;
   forming a patterned photoresist layer on the material layer in the first region, wherein the patterned photoresist layer exposes the top surface of the material layer in the second region, and a top surface of the patterned photoresist layer is higher than the top surface of the material layer in the second region;
   performing a first etching process on the patterned photoresist layer, so that the top surface of the patterned photoresist layer and the top surface of the material layer in the second region have substantially the same height;
   performing a second etching process on the patterned photoresist layer and the material layer, wherein in the second etching process, an etching rate of the patterned photoresist layer is substantially the same as an etching rate of the material layer;
   performing following steps before forming the material layer:
      forming a buried word line structure in the substrate in the memory cell region;
      forming a bit line structure on the substrate on a first side of the buried word line structure;
      forming a first hard mask layer on the bit line structure; and
      forming a first cap layer on the first hard mask layer;
   forming a contact on the substrate on a second side of the buried word line structure before forming the material layer, wherein the first side and the second side are opposite sides of the buried word line structure; and
   forming a second hard mask layer on the contact before forming the material layer, wherein
   a top surface of the first cap layer is higher than a top surface of the second hard mask layer, and
   the second hard mask layer is removed by the second etching process.

2. The planarization method according to claim 1, wherein in the first etching process, an etching rate of the patterned photoresist layer is greater than an etching rate of the material layer.

3. The planarization method according to claim 1, wherein the first etching process comprises a dry etching process.

4. The planarization method according to claim 1, wherein a gas used in the first etching process comprises oxygen ($O_2$), sulfur dioxide ($SO_2$), nitrogen ($N_2$), hydrogen ($H_2$), carbon monoxide (CO), carbon dioxide ($CO_2$), or a combination thereof.

5. The planarization method according to claim 1, wherein after the second etching process is performed, an entire structure height of the first region is substantially the same as an entire structure height of the second region.

6. The planarization method according to claim 1, wherein the patterned photoresist layer is removed by the second etching process.

7. The planarization method according to claim 1, wherein the second etching process comprises a dry etching process.

8. The planarization method according to claim 1, wherein the second etching process comprises a non-selective etching process.

9. The planarization method according to claim 1, wherein a gas used in the second etching process comprises carbon fluoride.

10. The planarization method according to claim 1, further comprising:
    forming a transistor on the substrate in the peripheral circuit region, wherein the transistor comprises:
       a gate located on the substrate; and
       a dielectric layer located between the gate and the substrate;
    forming a third hard mask layer on the gate; and
    forming a second cap layer on the second hard mask layer.

11. The planarization method according to claim 10, wherein the material layer covers the first cap layer and the second cap layer.

12. A planarization method, comprising:
    providing a substrate, wherein the substrate comprises a first region and a second region, the first region is a central region and the second region is an edge region, or the first region is the edge region and the second region is the central region, and the central region comprises a memory cell region, and the edge region comprises a peripheral circuit region;

forming a material layer on the substrate, wherein a top surface of the material layer in the first region is lower than a top surface of the material layer in the second region;

forming a patterned photoresist layer on the material layer in the first region, wherein the patterned photoresist layer exposes the top surface of the material layer in the second region, and a top surface of the patterned photoresist layer is higher than the top surface of the material layer in the second region;

performing a first etching process on the patterned photoresist layer, so that the top surface of the patterned photoresist layer and the top surface of the material layer in the second region have substantially the same height;

performing a second etching process on the patterned photoresist layer and the material layer, wherein in the second etching process, an etching rate of the patterned photoresist layer is substantially the same as an etching rate of the material layer; and performing following steps before forming the material layer:
  forming a buried word line structure in the substrate in the memory cell region;
  forming a bit line structure on the substrate aside the buried word line structure;
  forming a first hard mask layer on the bit line structure;
  forming a first cap layer on the first hard mask layer;
  forming a transistor on the substrate in the peripheral circuit region, wherein the transistor comprises:
    a gate located on the substrate; and
    a dielectric layer located between the gate and the substrate;
  forming a second hard mask layer on the gate; and
  forming a second cap layer on the second hard mask layer, wherein a top surface of the second cap layer is higher than a top surface of the first cap layer.

13. A planarization method, comprising:

providing a substrate, wherein the substrate comprises a first region and a second region, the first region is a central region and the second region is an edge region, or the first region is the edge region and the second region is the central region, and the central region comprises a memory cell region, and the edge region comprises a peripheral circuit region;

forming a material layer on the substrate, wherein a top surface of the material layer in the first region is lower than a top surface of the material layer in the second region;

forming a patterned photoresist layer on the material layer in the first region, wherein the patterned photoresist layer exposes the top surface of the material layer in the second region, and a top surface of the patterned photoresist layer is higher than the top surface of the material layer in the second region;

performing a first etching process on the patterned photoresist layer, so that the top surface of the patterned photoresist layer and the top surface of the material layer in the second region have substantially the same height;

performing a second etching process on the patterned photoresist layer and the material layer, wherein in the second etching process, an etching rate of the patterned photoresist layer is substantially the same as an etching rate of the material layer; and performing following steps before forming the material layer:
  forming a buried word line structure in the substrate in the memory cell region;
  forming a bit line structure on the substrate aside the buried word line structure;
  forming a first hard mask layer on the bit line structure;
  forming a first cap layer on the first hard mask layer;
  forming a transistor on the substrate in the peripheral circuit region, wherein the transistor comprises:
    a gate located on the substrate; and
    a dielectric layer located between the gate and the substrate;
  forming a second hard mask layer on the gate; and
  forming a second cap layer on the second hard mask layer, wherein
the planarization method further comprises:
  performing the second etching process on the first cap layer, the second cap layer, the first hard mask layer, and the second hard mask layer.

14. The planarization method according to claim 13, wherein in the second etching process, the etching rate of the patterned photoresist layer, the etching rate of the material layer, an etching rate of the first cap layer, an etching rate of the second cap layer, an etching rate of the first hard mask layer, and an etching rate of the second hard mask layer are substantially the same.

* * * * *